United States Patent
Palumbo et al.

(10) Patent No.: US 9,461,104 B2
(45) Date of Patent: Oct. 4, 2016

(54) SEMICONDUCTOR DEVICE INTEGRATING A VOLTAGE DIVIDER AND PROCESS FOR MANUFACTURING A SEMICONDUCTOR DEVICE

(71) Applicant: STMicroelectronics S.r.l., Agrate Brianza (MB) (IT)

(72) Inventors: Vincenzo Palumbo, Vimercate (IT); Mirko Venturato, Cabiate (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 0 days.

(21) Appl. No.: 14/309,357

(22) Filed: Jun. 19, 2014

(65) Prior Publication Data
US 2015/0001677 A1      Jan. 1, 2015

(30) Foreign Application Priority Data

Jun. 28, 2013   (IT) .............................. TO2013A0541

(51) Int. Cl.

| | |
|---|---|
| *H01L 49/02* | (2006.01) |
| *H01L 23/522* | (2006.01) |
| *H01L 27/02* | (2006.01) |
| *H01L 27/06* | (2006.01) |
| *H01L 29/40* | (2006.01) |
| *H01L 29/66* | (2006.01) |

(Continued)

(52) U.S. Cl.
CPC ........... *H01L 28/20* (2013.01); *H01L 23/5225* (2013.01); *H01L 23/5228* (2013.01); *H01L 27/0207* (2013.01); *H01L 27/0629* (2013.01); *H01L 29/405* (2013.01); *H01L 29/66681* (2013.01); *H01L 29/7817* (2013.01); *G01R 15/04* (2013.01); *H01L 23/585* (2013.01); *H01L 29/0696* (2013.01); *H01L 29/1095* (2013.01); *H01L 2924/0002* (2013.01)

(58) Field of Classification Search
CPC ............... H01L 28/20; H01L 27/0802; H01L 29/0692; H01L 29/1033; H01L 23/585; H01L 27/0629; H01L 23/5228; H01L 27/0207; H01L 23/552; H01L 23/62; H03H 5/00; G01R 15/04; G05F 1/462
See application file for complete search history.

(56) References Cited

U.S. PATENT DOCUMENTS

| | | | | |
|---|---|---|---|---|
| 4,210,465 A | * | 7/1980 | Brower ................. | H01L 21/033 257/375 |
| 5,530,418 A | * | 6/1996 | Hsu ........................ | H01L 28/20 257/E21.004 |

(Continued)

FOREIGN PATENT DOCUMENTS

| | | | | |
|---|---|---|---|---|
| JP | WO 2009078274 A1 | * | 6/2009 | ......... H01L 27/0629 |
| WO | WO 2009078274 A1 | * | 6/2009 | |

OTHER PUBLICATIONS

Italian Search Report and Written Opinion dated Mar. 13, 2014 from corresponding Italian Application No. TO2013A000541.

*Primary Examiner* — Ermias Woldegeorgis
(74) *Attorney, Agent, or Firm* — Seed IP Law Group PLLC

(57) ABSTRACT

A semiconductor device includes: a semiconductor substrate; a high-voltage first resistive structure which extends along a spiral path above the substrate and is separated from the substrate by a first dielectric layer; and a conductive shielding structure, including a plurality of first shielding strips, which are arranged in sequence along respective portions of the first resistive structure and are separated from the first resistive structure by a second dielectric layer.

17 Claims, 9 Drawing Sheets

(51) Int. Cl.
*H01L 29/78* (2006.01)
*G01R 15/04* (2006.01)
*H01L 23/58* (2006.01)
*H01L 29/06* (2006.01)
*H01L 29/10* (2006.01)

(56) References Cited

U.S. PATENT DOCUMENTS

| | | | |
|---|---|---|---|
| 6,165,861 A * | 12/2000 | Liu | H01L 28/20 257/E21.004 |
| 2004/0219744 A1 * | 11/2004 | Oh | H01L 21/76889 438/238 |
| 2005/0056912 A1 * | 3/2005 | Ninomiya | H01L 29/0619 257/565 |
| 2010/0022064 A1 * | 1/2010 | Hall | H01L 27/0288 438/382 |
| 2012/0154026 A1 * | 6/2012 | Karino | H01L 27/0629 327/543 |
| 2012/0280361 A1 | 11/2012 | Su et al. | |
| 2012/0313692 A1 | 12/2012 | Sutardja et al. | |
| 2012/0319240 A1 | 12/2012 | Su et al. | |
| 2013/0032922 A1 | 2/2013 | Kawahara et al. | |
| 2013/0070429 A1 | 3/2013 | Depetro et al. | |

* cited by examiner

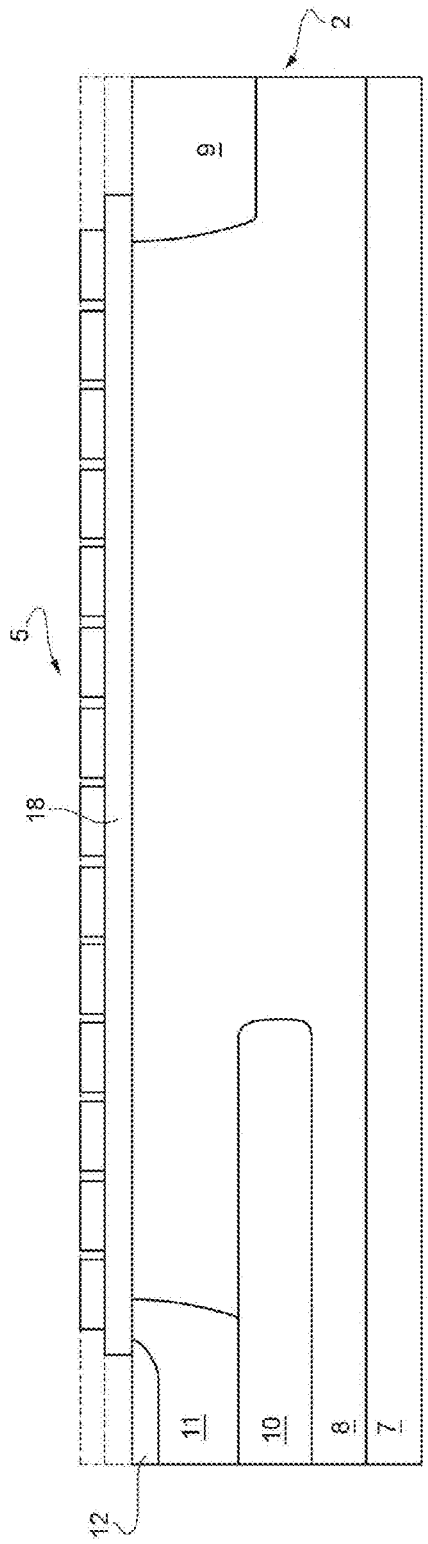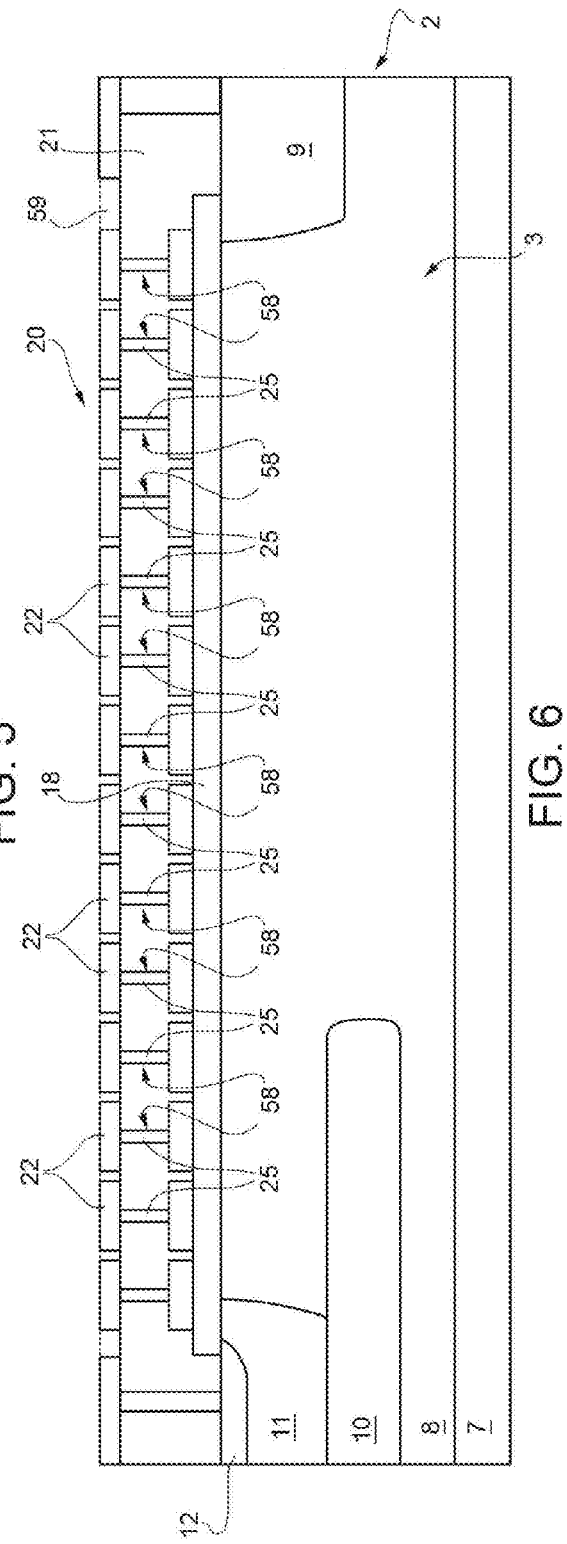

SEMICONDUCTOR DEVICE INTEGRATING A VOLTAGE DIVIDER AND PROCESS FOR MANUFACTURING A SEMICONDUCTOR DEVICE

CROSS REFERENCE TO RELATED APPLICATIONS

This application claims the priority benefit of Italian Patent Application No. TO2013A000541, filed Jun. 28, 2013, and which application is hereby incorporated by reference to the maximum extent allowable by law.

BACKGROUND

1. Technical Field

The present disclosure relates to a semiconductor device integrating a voltage divider and to a process for manufacturing a semiconductor device.

2. Discussion of the Related Art

Known to the art are particular types of semiconductor devices integrating resistors for medium-to-high voltage applications, which are capable of withstanding voltages on the order of some hundreds of volts or even higher.

For example, in power supplies and/or battery chargers of many portable electronic devices, semiconductor voltage dividers are used for detecting the grid voltage, as well as for performing further functions. In these cases, the resistors should withstand voltages of 500-800 V.

Some types of resistors suitable for medium and high voltages comprise polysilicon strips, which extend along a spiral path and are provided on a semiconductor substrate, with interposition of a dielectric layer. The radially inner terminal of the spiral resistor is generally coupled to a high-voltage line, whereas the radially outer terminal is coupled to a low-voltage line. If need be, in order to provide a voltage divider, a tap is formed with a contact towards the outside at an intermediate point of the resistive spiral.

Resistors of this type exploit very well the available area and do not present corners, which could easily lead to conditions of breakdown, given the voltages involved. However, known high-voltage resistors suffer from some limitations.

In the first place, the resistors are made of doped polysilicon and are subject to voltage differences with respect to the surrounding regions, both towards the substrate, and, in the opposite direction, towards the package or some protection structures, or else may be exposed to interfaces and/or dielectrics with trapped electrical charge. The voltage differences that are created cause depletion regions at the interface of the polysilicon forming the resistors and reduce the conduction section, increasing the resistivity. Moreover, the extension of the depletion regions and the corresponding influence on the resistance depend upon the voltage applied and on the local bias conditions and hence the effects are variable, moreover in a non-linear way, along the resistor. According to the bias conditions, not only may the value of overall resistance vary, but the division ratio of a voltage divider is not constant either. For example, the division ratio may vary by several percentage points when the voltage across the divider varies between 0 V and 500 V, whereas a more contained variation would be desirable.

In order to limit the effects of the voltage difference with respect to the substrate, it has been proposed to integrate a power component, for example a MOSFET, with cylindrical symmetry concentric to the spiral resistor. The power component has a radial-conduction diffusion region in which the distribution of equipotential lines is substantially equal to the voltage drop along the resistor and prevents depletion of the polysilicon. This solution has proven effective in limiting the effects due to the substrate, but has no effect as regards the package and the overlying protection structures.

Other limitations depend upon the presence of metallization regions in the proximity of parts of the resistor (in particular, at the high-voltage and low-voltage contacts and at the intermediate tap of a voltage divider). During the manufacturing process, in fact, steps of annealing in a forming gas are carried out, during which the resistivity of the polysilicon is modified. The metallization regions provide a shielding function in regard to the underlying polysilicon regions so that the action of the forming gas during annealing is attenuated. The effects of annealing in these conditions are not uniform and have a low predictability.

It would be desirable to provide a semiconductor device and a process for manufacturing a semiconductor device that will reduce the described limitations.

SUMMARY

According to an embodiment, there is provided a semiconductor device comprising a semiconductor substrate; a high-voltage first resistive structure extending along a spiral path above the substrate and separated from the substrate by a first dielectric layer; and a conductive shielding structure, comprising a plurality of first shielding strips arranged in sequence along respective portions of the first resistive structure and separated from the first resistive structure by a second dielectric layer.

According to an embodiment, the first shielding strips are electrically coupled to respective portions of the first resistive structure by plugs arranged through the second dielectric layer.

According to an embodiment, the semiconductor device includes ohmic contact regions in positions corresponding to respective plugs.

According to an embodiment, the first shielding strips are not directly in contact with one another.

According to an embodiment, the first shielding strips are coplanar with one another and parallel to the first resistive structure.

According to an embodiment, the first resistive structure comprises a semiconductor strip extending along the spiral path.

According to an embodiment, the first shielding strips have a width substantially equal to a width of the semiconductor strip forming the first resistive structure.

According to an embodiment, each first shielding strip extends over an angle not greater than 10°, for example, less than 6°.

According to an embodiment, the semiconductor device includes a second resistive structure extending along a spiral path above the substrate, separated from the substrate by the first dielectric layer and concentric to the first resistive structure; and wherein the shielding structure, comprises a plurality of second shielding strips arranged in sequence along respective portions of the second resistive structure and separated from the second resistive structure by the second dielectric layer.

According to an embodiment, the second shielding strips are electrically coupled to respective portions of the second resistive structure by further plugs arranged through the second dielectric layer.

According to an embodiment, the second shielding strips are not directly in contact with one another and with the first shielding strips.

According to an embodiment, the first resistive structure has a first terminal, a second terminal and an outlet node and comprises a first resistor between the first terminal and the outlet node, and a second resistor, between the second terminal and the outlet node, the first resistor and the second resistor forming a voltage divider.

According to an embodiment, the semiconductor device includes a supply line, the first resistive structure being coupled between terminals of the supply line.

According to an embodiment, the semiconductor devices includes a power component in the substrate in a region corresponding to the first resistive structure, the power component having conduction terminals coupled to the first resistive structure.

According to an embodiment, there is provided a process for manufacturing a semiconductor device including forming a first dielectric layer on a semiconductor substrate; forming, on the first dielectric layer, a resistive structure extending along a spiral path; forming a second dielectric layer on the first dielectric layer, so as to incorporate the resistive structure; and forming a conductive shielding structure, comprising a plurality of shielding strips arranged in sequence along respective portions of the resistive structure.

According to an embodiment, the method includes performing an annealing after having formed the shielding structure.

According to an embodiment, performing an annealing includes using forming gas.

According to an embodiment, forming the shielding structure includes forming, in the second dielectric layer, apertures exposing respective portions of the resistive structure; filling the apertures with conductive material; depositing a metallic layer in contact with the conductive material in the apertures; and shaping the metallic layer so as to obtain the shielding strips.

BRIEF DESCRIPTION OF THE DRAWINGS

For a better understanding, some embodiments will now be described, purely by way of non-limiting example and with reference to the attached drawings, wherein:

FIGS. 5 and 6 are cross sections through the chip of FIG. 2, in successive steps of a process for manufacturing the semiconductor device of FIG. 2;

DETAILED DESCRIPTION

Figure 1:
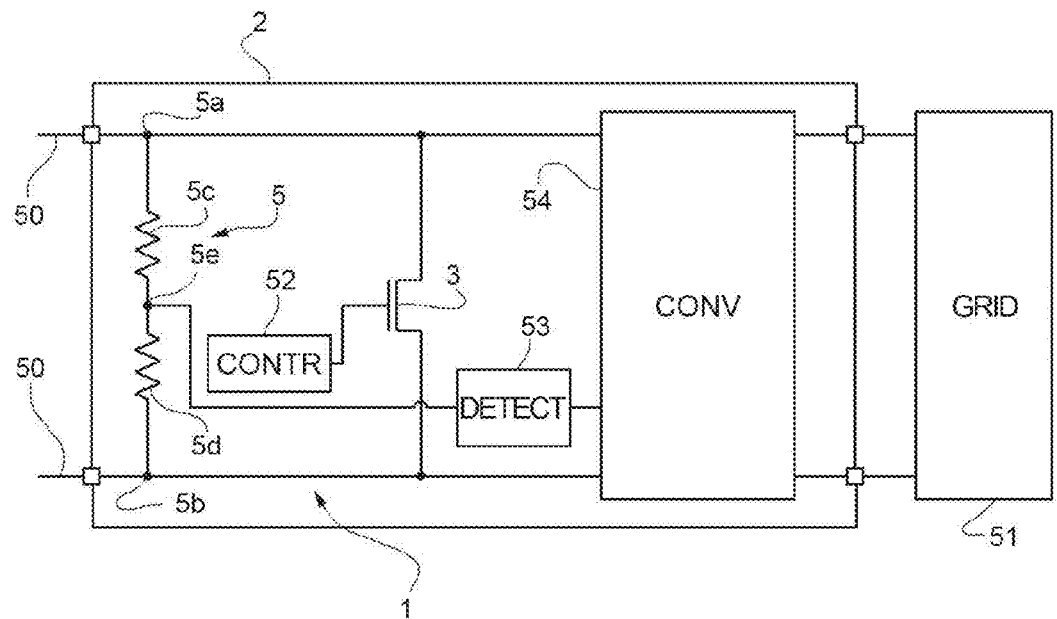
FIG. 1 shows an electrical diagram of an electronic apparatus.

In FIG. 1, reference number 1 designates a semiconductor device made in a chip 2. In one embodiment, the semiconductor device 1 may comprise or be incorporated in a power supply or a battery charger for a portable electronic device, such as a cellphone, a tablet, a portable computer, a video camera, a photographic camera, a console for videogames, and so on. In particular, FIG. 1 also shows an electrical supply line 50, for example supplying a 220-V, 50-Hz or 110-V, 60-Hz a.c. voltage, and an electronic apparatus 51 supplied through the semiconductor device 1. It is in any case understood that the embodiments may advantageously be used also for applications and in environments different from what has been mentioned above, in all the cases where it is necessary to use a resistive power component.

The semiconductor device 1 comprises an active power component, in particular a MOS transistor 3, and a high-voltage resistive structure 5, which are incorporated in the chip 2. The resistive structure 5 has a first terminal 5a and a second terminal 5b respectively coupled to a (high-voltage) drain terminal and to a (low-voltage) source terminal of the MOS transistor 3, which are in turn coupled to the electrical supply line 50. The control circuit 52 is configured to cause the MOS transistor 3 to switch-on and switch-off and for this purpose is coupled to the gate terminal of the latter.

The resistive structure moreover includes a first resistor 5c and a second resistor 5d, which have a common outlet node 5e and form a voltage divider. In a non-limiting embodiment, the outlet node 5e is coupled to a detection module 53, which supplies a measurement of the voltage present on the outlet node 5e itself.

FIG. 1 moreover shows a circuit 54 integrated in the chip 2 and coupled to the MOS transistor 3 and to the high-voltage resistive structure 5. The circuit 54 may include, for example, a converter, in particular an AC-to-DC converter, sensors, and control modules and may be completely analog or comprise logic modules incorporating code portions. The circuit 54 may be provided also in a chip distinct from the chip 2.

Figure 2:
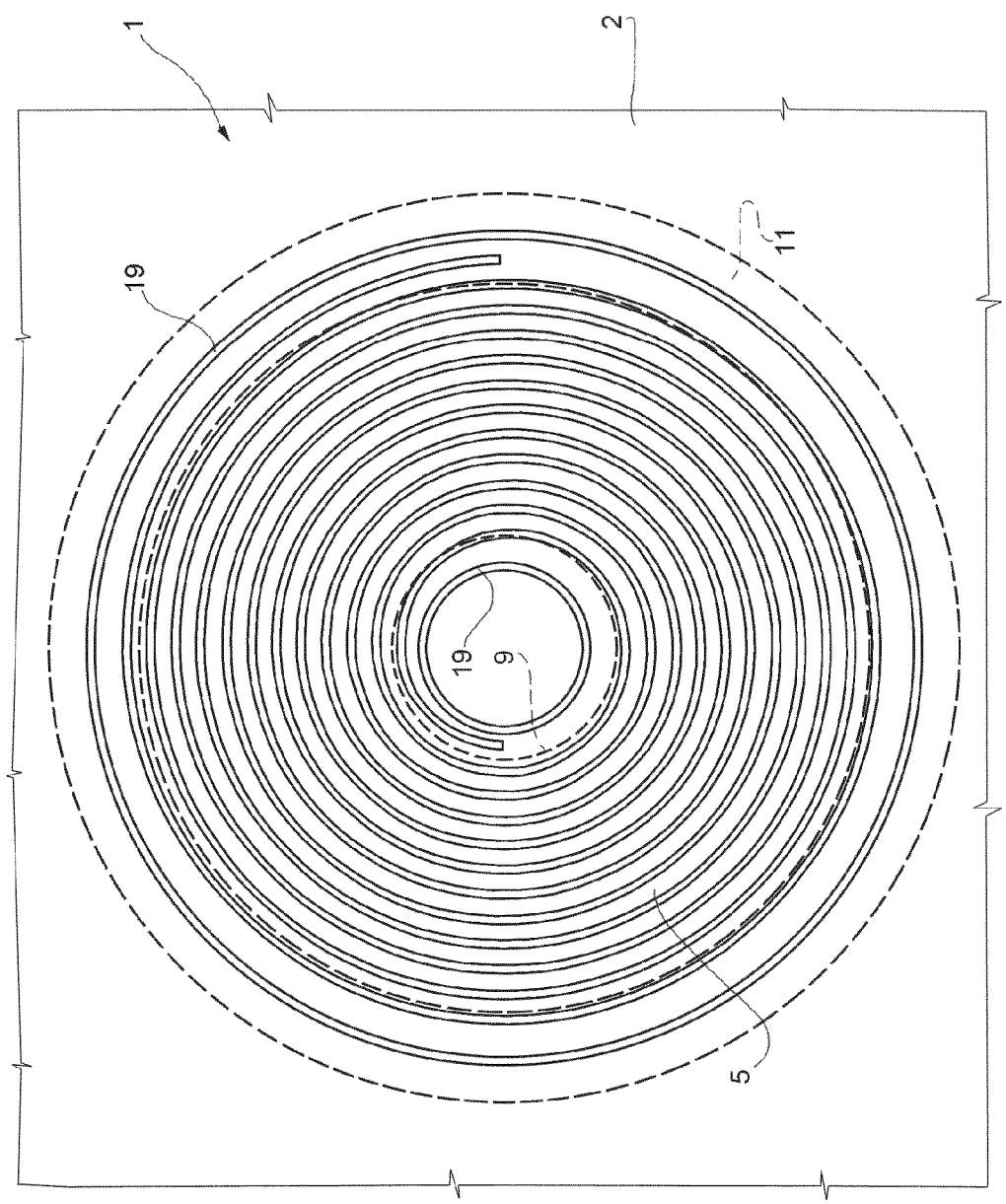
FIG. 2 is a top plan view with parts removed of a chip integrating a semiconductor device according to one embodiment and incorporated in the electronic apparatus of FIG. 1.
Figure 3:
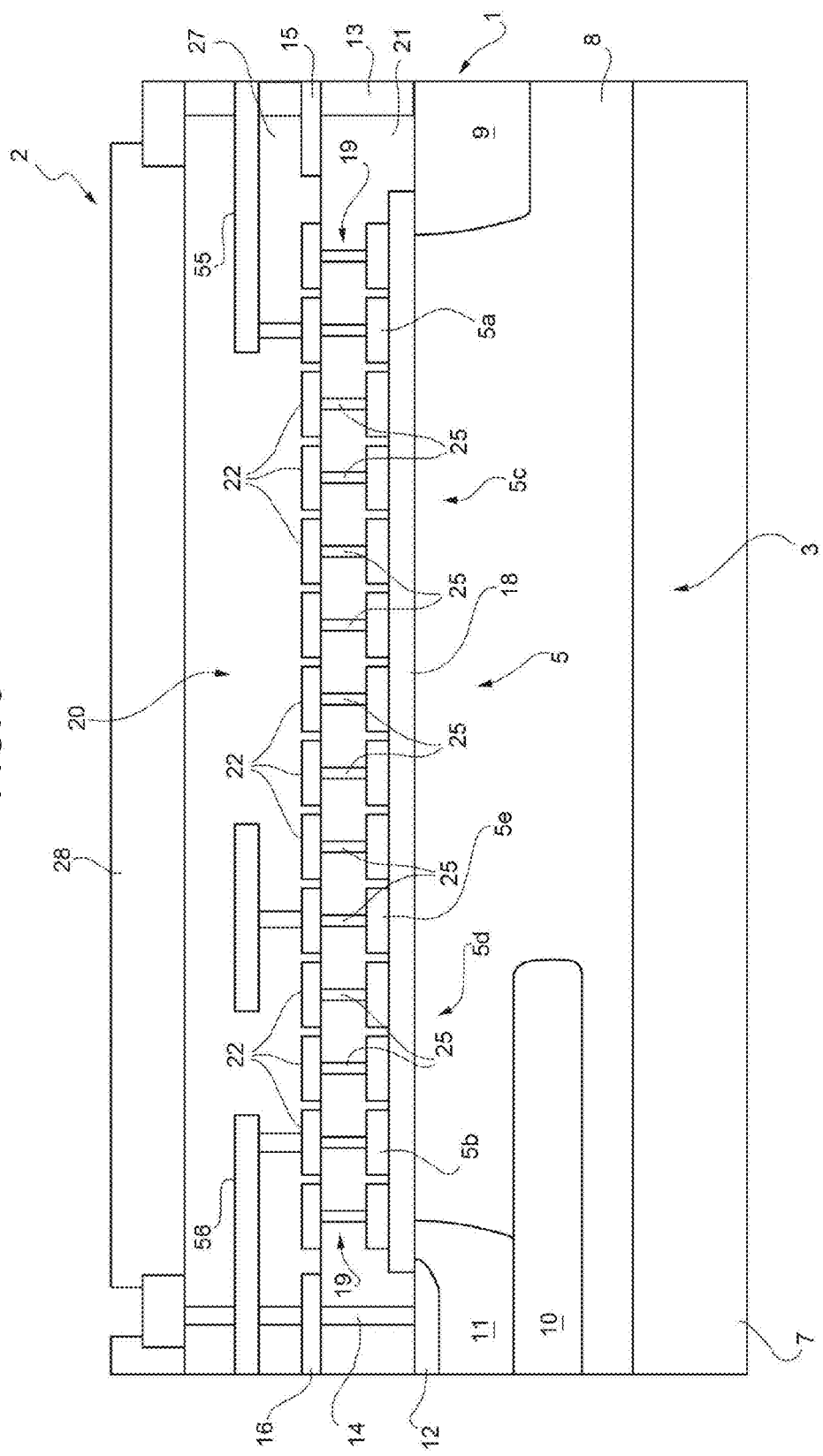
FIG. 3 is a cross section through the semiconductor device of FIG. 2, taken along the line III-III of FIG. 2.

As shown in greater detail in FIGS. 2 and 3, the chip 2 comprises a substrate 7 made of semiconductor material having a first type of conductivity, for example monocrystalline silicon of a P− type, where a well 8 of opposite conductivity, for example N−, is provided.

The MOS transistor 3 (FIG. 2) has a circular shape and is housed in the well 8, which functions as drift region. The MOS transistor 3 comprises a central drain region 9, of an N type, a buried annular region 10, and a body region 11, which extends in depth until it comes into contact with the buried annular region 10. A source region 12 is formed in the body region 11. The drain and source terminals are defined by respective plugs 13, 14, which contact the drain region 9 and the source region 12, and by respective pads 15, 16, obtained from a single metallization layer. The outlet node 5e is set along the path of the resistive structure 5 so as to obtain the desired division ratio between the first resistor 5c (defined between the first terminal 5a and the outlet node 5e) and the second resistor 5d (defined between the outlet node 5e and the second terminal 5b).

The resistive structure 5 comprises a continuous strip of doped polysilicon, which extends along a spiral path over an annular region overlying the well 8 and radially comprised substantially between the drain region 9 and the body region 11. A dielectric layer 18, for example, a silicon-oxide layer, electrically insulates the resistive structure 5 from the well 8. In one embodiment, the polysilicon strip that forms the resistive structure 5 has a constant cross section and a uniform doping level and moreover extends along a spiral path with constant pitch. In other embodiments (not illustrated), however, the cross section, doping level, and pitch of the spiral may be variable. Also the shape of the spiral may differ (for example, it could have oval or quadrangular turns with rounded vertices).

One radially internal end of the resistive structure 5, which defines the first terminal 5a, is coupled, via a coupling line 55, to the pad 15 forming the drain terminal of the MOS transistor 3. One radially external end of the resistive structure 5, which defines the second terminal 5b, is coupled, via a line 56, to the pad 16 forming the source terminal of the MOS transistor 3.

The lines 55, 56 are both obtained from a further metallization layer.

In one embodiment, the insulating structure 5 is surrounded by at least one external "dummy" turn 19, which has only the purpose of preventing inhomogeneities in the resistive structure 5, that may be caused by edge effects during lithographic processes with which the resistive structure 5 itself is defined.

Figure 4:
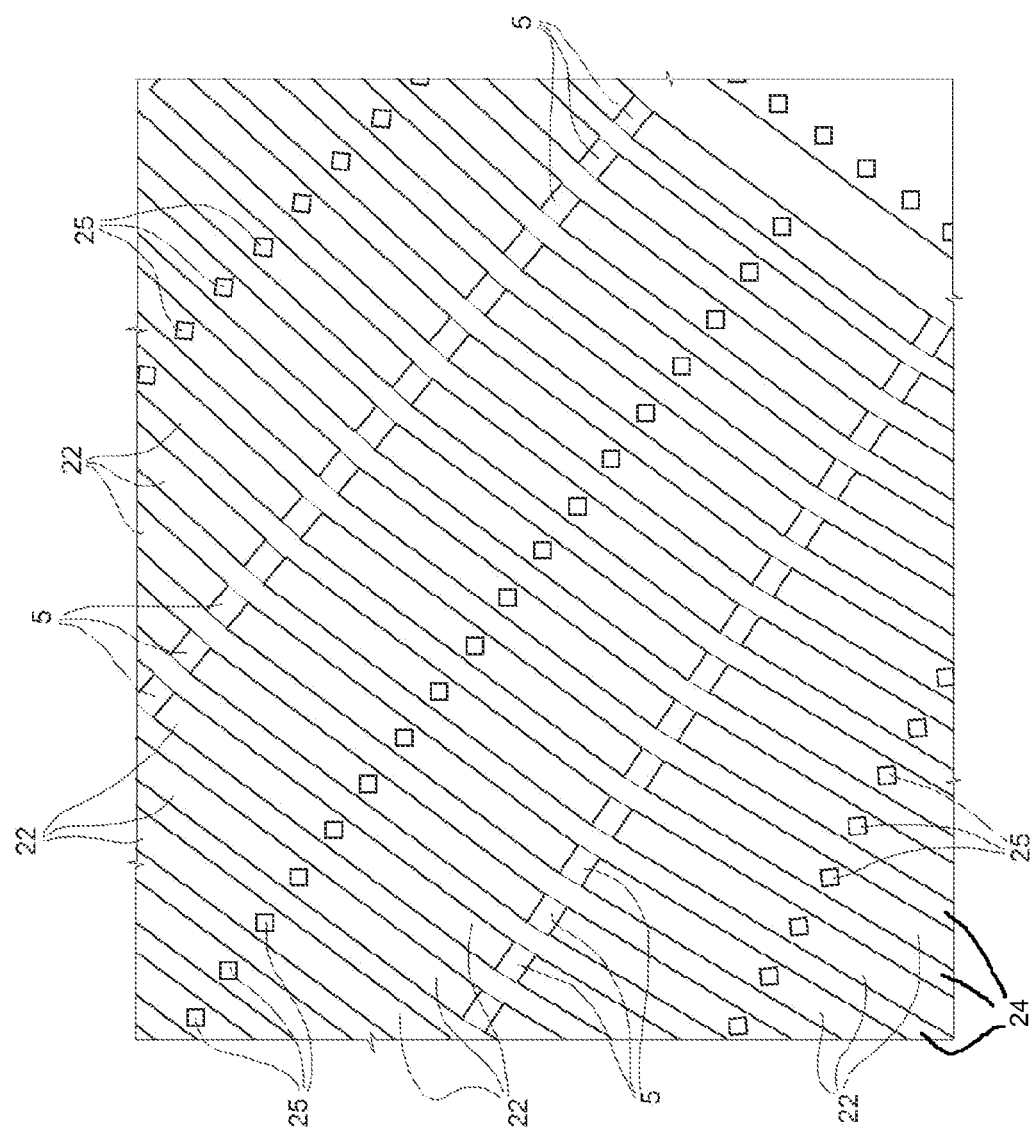
FIG. 4 is an enlarged top plan view of a detail of the semiconductor device of FIG. 2.

With reference to FIGS. 3 and 4, the resistive structure 5 is overlaid by a shielding structure 20. A dielectric layer 21 is arranged between the resistive structure 5 and the shielding structure 20. In detail, the shielding structure 20 comprises a plurality of coplanar metal shielding strips 22, which extend along respective portions of the resistive structure 5. The shielding strips 22 are parallel to the resistive structure 5 and are obtained from a single metallization layer, which, in one embodiment, is the same layer as the one from which the pads 15, 16 of the drain and source contacts of the MOS transistor 3 are obtained. For example, the shielding strips 22 may be made of copper or aluminium.

The shielding strips 22 have a width substantially equal to the width of the polysilicon strip that defines the resistive structure 5 or slightly greater, but in any case such as to prevent contact between adjacent shielding strips 22 in the radial direction. Moreover, the length of each shielding strip 22 is such that the maximum voltage difference between the ends of the corresponding portion of the resistive structure 5 is less than a threshold selected so as not to cause significant depletion in the underlying polysilicon. For example, each strip extends over an angle of less than approximately 10° and preferably less than approximately 6°. In one embodiment, 64 shielding strips 22 correspond to each turn of the resistive structure 5. In one embodiment (not illustrated), the shielding strips 22 have the same length.

The shielding strips 22 may follow faithfully the spiral path of the resistive structure 5 or else they may be approximations, given that they extend in any case for a short portion. In the embodiment of FIG. 4, for example, the shielding strips 22 are rectilinear.

The shielding strips 22 are arranged in sequence throughout the path of the resistive structure 5. Consecutive shielding strips 22 are separated by discontinuity regions 24 and are not directly in contact with one another.

The shielding strips 22 are electrically coupled to the underlying portions of the resistive structure 5 by respective plugs 25 arranged through the dielectric layer 21. Consequently, each shielding strip 22, in use, is set at a respective potential determined by the point of contact with the resistive structure 5. In one embodiment, the plugs 25 are arranged at the center of the respective shielding strips 22.

The outlet node 5e is defined by a pad 27 and by a plug 28, which contacts the shielding strip 22 coupled to the point of the resistive structure 5 that provides the desired division ratio between the first resistor 5a (between the first terminal 5a and the outlet node 5e) and the second resistor 5b (between the outlet node 5e and the second terminal 5b). In one embodiment, the pad 27 is obtained from the same metallization layer as the one from which also the lines 55, 56 are obtained.

A dielectric layer 27 encapsulates the shielding structure 20 and is coated by a passivation layer 28, which has apertures for contacts, in particular where the first terminal 5a and the second terminal 5b of the resistive structure 5 are provided.

The presence of the shielding structure 20 provides multiple advantages. A first advantage emerges during manufacture of the device, when annealing in forming gas is carried out. In brief, with reference to FIG. 5, manufacture of the device 1 initially envisages forming the MOS transistor 3 in the substrate 2. After having formed the dielectric layer 18, a layer of doped polysilicon is deposited and patterned using a photolithographic process to form the resistive structure 5.

Next (FIG. 6), the dielectric layer 21 is deposited on the dielectric layer 18 so as to incorporate the resistive structure 5.

The dielectric layer 18 is then selectively etched to obtain apertures 58 that expose respective portions of the resistive structure 5.

After the apertures 58 have been filled with a conductive material, thus forming the plugs 25, a metallic layer 59 is deposited in contact with the plugs 25 and patterned by a photolithographic process to provide the shielding strips 22 of the shielding structure 20.

A process of annealing in forming gas is then carried out. In this step, the shielding structure 20 prevents inhomogeneous effects from being produced on the resistive structure. This uniform protective action leads to a general improvement in the response of the resistive structure 5, with particular regard to the division ratio between the first resistor 5c and the second resistor 5d, as compared to the case where metallizations are present only at the contacts.

The manufacturing process is then completed with further processing steps, until the structure of FIGS. 3 and 4 is obtained.

A further important advantage is achieved by coupling of the shielding strips 22 with respective regions of the resistive structure 5. The protective strips 22 remain in fact uniformly biased at the potential imposed by the respective contact with the resistive structure 5. The maximum voltage to which the interface of the resistive structure 5 is subjected is hence determined at the edges of the shielding strips 22 and is in any case weak even in the presence of high differences of potential between the terminals 5a, 5b, since the shielding strips 22 extend in length just for a short portion. Consequently, the effect of depletion of the resistive structure 5 on the side of the shielding structure 20 is markedly attenuated, with considerable benefits both in terms of linearity of response of the resistive structure 5 as a function of the voltage applied and in terms of stability of the division ratio.

Figure 7:
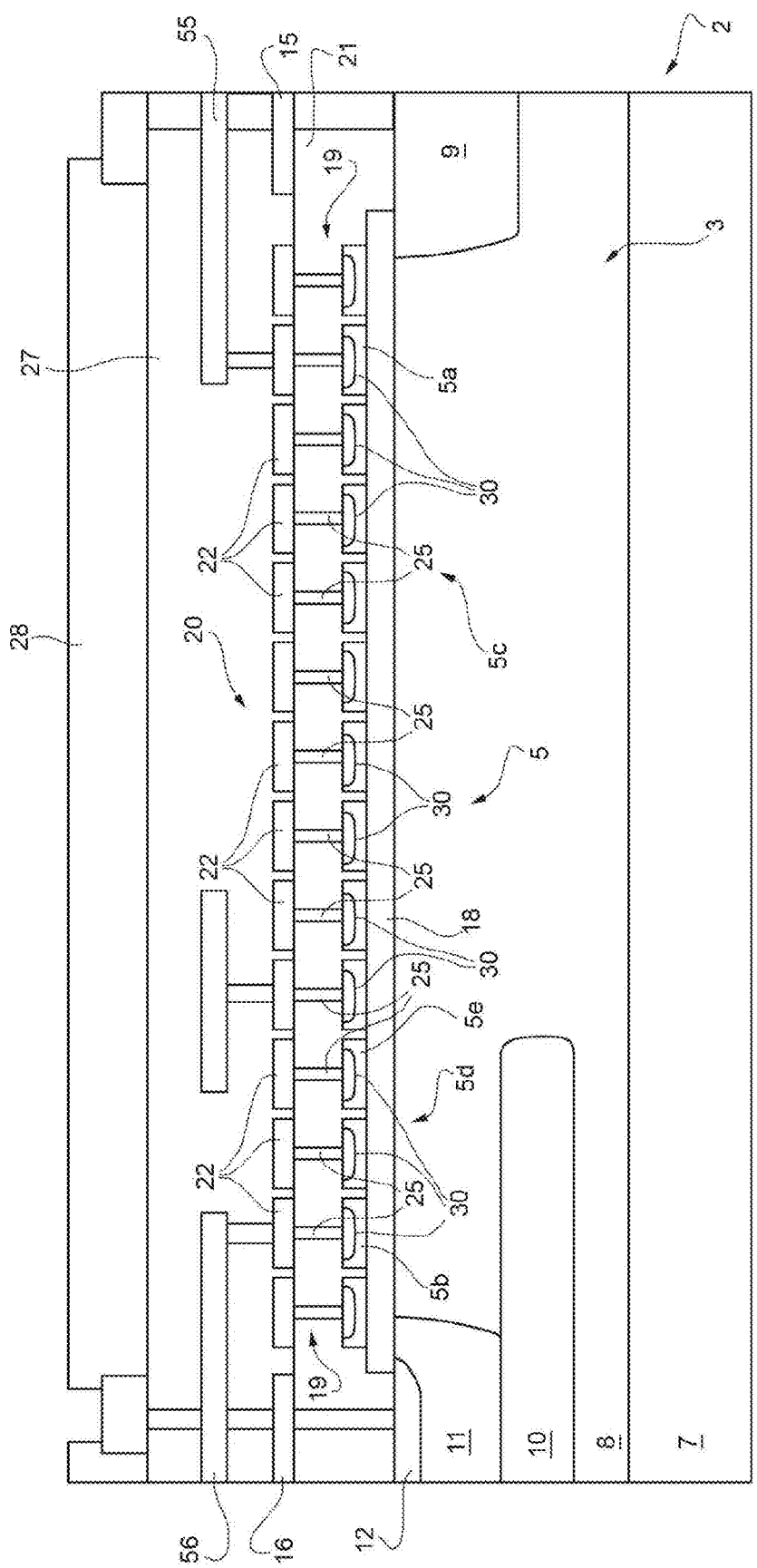
FIG. 7 is a cross section through a semiconductor device according to another embodiment.

In the embodiment illustrated in FIG. 7, the resistive structure 5 is provided with ohmic contact regions 30 with a high level of doping, for example of an N+ type, at respective plugs 25 for coupling to the shielding structure 20.

Figure 8:
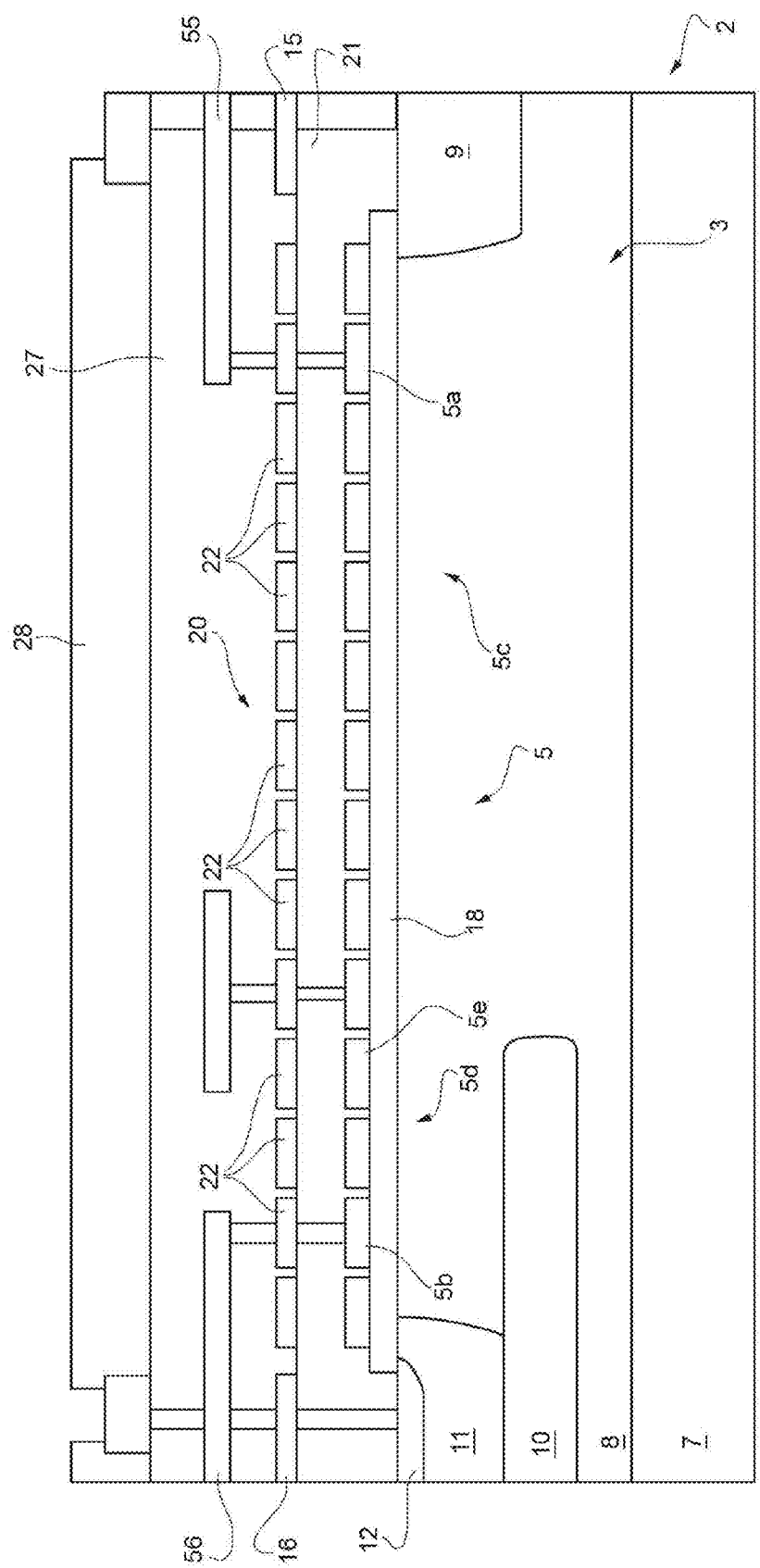
FIG. 8 is a cross section through a semiconductor device according to another embodiment.

In the embodiment illustrated in FIG. 8, the shielding strips 22 of the shielding structure 20 are insulated from the resistive structure 5 without any electrical coupling, except for the shielding strips 22 in positions corresponding to the drain and source terminals of the MOS transistor 3 and to the outlet node 5e. In this case, there is only the benefit linked to the uniform protection of the shielding structure 20 during the annealing step.

Figure 9:
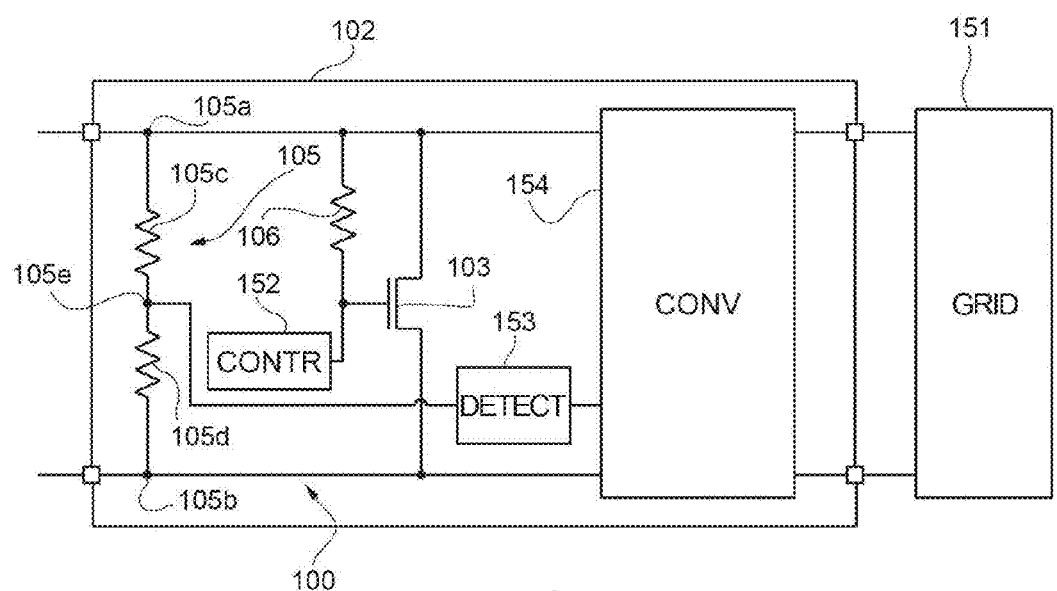
FIG. 9 shows an electrical diagram of a further electronic apparatus.

FIG. 9 shows an electrical diagram for a semiconductor device 100 according to another embodiment.

The device 100 is integrated in a chip 102 and comprises an active power component, in particular a MOS transistor 103, a first resistive structure 105, and a second resistive structure 106 incorporated in the chip 102. The resistive structure 105 has a first terminal 105a and a second terminal 105b, which are respectively coupled to a (high-voltage) drain terminal and to a (low-voltage) source terminal of the MOS transistor 103.

The resistive structure moreover includes a first resistor 105c and a second resistor 105d which have a common outlet node 105e and form a voltage divider. The outlet node 105e is coupled to a detection block 153 that supplies a measurement of the voltage present on the outlet node 105e itself.

The second resistive structure 106 has terminals coupled, respectively, to the drain and gate terminals of the MOS transistor 103 and is used as field plate. The gate terminal is moreover coupled to a control circuit 152, configured to cause the MOS transistor 103 to switch-on and switch-off.

FIG. 9 also shows an electrical-supply line 104, a circuit 154 integrated on the chip 102 and coupled to the MOS transistor 103 and an electronic apparatus 151 supplied through the semiconductor device 100.

Figure 10:
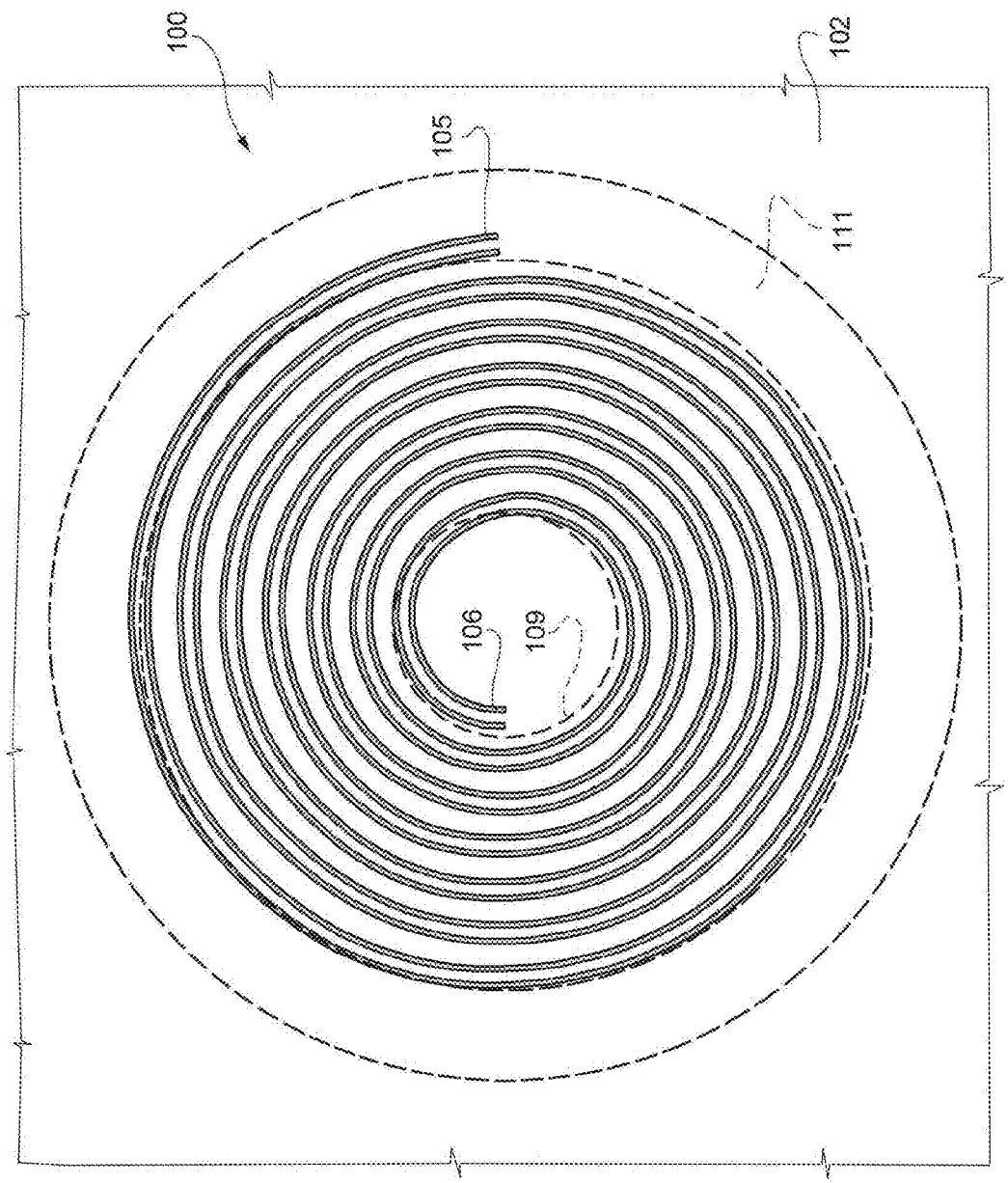
FIG. 10 is a top plan view with parts removed of a chip integrating a semiconductor device according to a further embodiment and incorporated in the electronic apparatus of FIG. 9.
Figure 11:
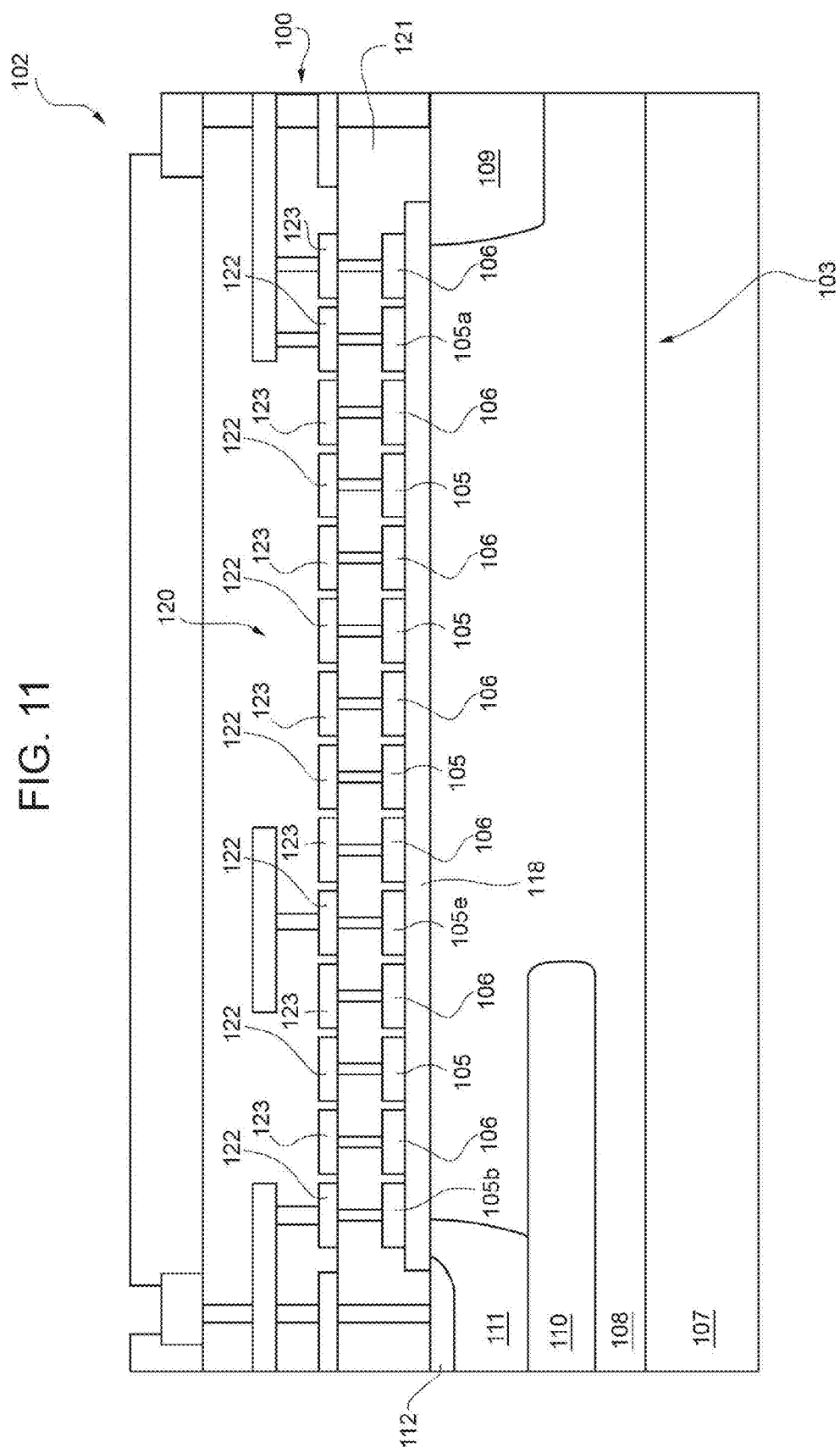
FIG. 11 is a cross section through the semiconductor device of FIG. 10, taken along the line XI-XI of FIG. 10.

With reference to FIGS. 10 and 11, the MOS transistor 103 and the first resistive structure 105 are made substantially as the MOS transistor 3 and the resistive structure 5 already described with reference to FIGS. 2 and 3. In particular, the MOS transistor 103 is formed on a substrate 107 of the chip 102 and comprises a central drain region 109, a buried annular region 110, a body region 111, which extends in depth as far as into contact with the buried annular region 110, and a source region 112, provided in the body region 111.

The resistive structure 105 comprises a continuous strip of doped polysilicon, which extends along a spiral path over an annular region overlying the well 108 and is radially comprised substantially between the drain region 109 and the body region 111. A dielectric layer 118 electrically insulates the resistive structure 105 from the well 108. One radially inner end of the resistive structure 105 is coupled to a contact forming the first terminal 105a and, via a coupling line 155, to a pad 115 forming the drain terminal of the MOS transistor 103. One radially outer end of the resistive structure 105 is coupled to a contact forming the second terminal 105b and, via a line 156, to a pad 116 forming the source terminal of the MOS transistor 103.

The second resistive structure 106 also extends along a spiral path over the annular region overlying the well 108 and radially comprised between the drain region 109 and the body region 111. The first resistive structure 105 and the second resistive region 106 are concentric, and their turns are interspersed in the radial direction. Hence, in practice, each turn of the first resistive region 105 is adjacent, on opposite sides along its path, to two respective turns of the second resistive region 106 and, conversely, each turn of the second resistive region 106 is adjacent, on opposite sides along its path, to two respective turns of the first resistive region 105.

In one embodiment, the first resistive structure 105 and the second resistive structure 106 have substantially the same length and cross section, selected so as to obtain desired values of resistance. In other embodiments, however, the length of the second resistive structure 106 could be different from, in particular shorter than, the length of the first resistive structure 105, according to convenience.

In one embodiment, the first insulating structure 105 and the second resistive structure 106 are surrounded by at least one external dummy structure (for simplicity not shown), which comprises a first turn, having the characteristics of the first insulating structure 105, and a second turn, having the characteristics of the second insulating structure 106.

The first resistive structure 105 and the second resistive structure 106 are overlaid by a shielding structure 120, with interposition of a dielectric layer 121. The shielding structure 120 comprises first shielding strips 122 and second shielding strips 123, obtained from a single metallization layer and coplanar to one another.

The first shielding strips 122 extend along respective portions of the first resistive structure 105, whereas the second shielding strips 123 extend along respective portions of the second resistive structure 106. The first shielding strips 122 and the second shielding strips 123 are arranged in sequence respectively along the entire path of the first resistive structure 105 and along the entire path of the second resistive structure 106. Consecutive first shielding strips 122 and second shielding strips 123 are separated by discontinuity regions and are not directly in contact with one another. Consequently, also the first shielding strips 122 and the second shielding strips 123 are arranged along spiral paths and are interspersed with one another in the radial direction.

The first shielding strips 122 and the second shielding strips 123 have a width that is substantially the same as the width of the polysilicon strips that define, respectively, the first resistive structure 105 and the second resistive structure 106, or slightly greater. In any case, first shielding strips 122 and second adjacent shielding strips 123 are not directly in contact with one another.

Moreover, the length of each first shielding strip 122 and of each second shielding strip 123 is such that the maximum difference of voltage between the end of the corresponding portions of the first resistive structure 105 and of the second resistive structure, respectively, is less than a threshold.

The first shielding strips 122 and the second shielding strips 123 are electrically coupled to respective underlying portions of the first resistive structure 105 by respective first plugs 125 and second plugs 126. Consequently, each first shielding strip 122 and second shielding strip 123, in use, is set at a respective potential determined by the point of contact with the first resistive structure 105 and with the second resistive structure 106, respectively.

Finally, it is clear that modifications and variations may be made to the semiconductor device and to the process described herein, without thereby departing from the scope of the present invention, as defined in the annexed claims.

In the first place, the shape, length, cross section, and number of turns of the resistive elements may be determined as a function of the specific requirements of the device.

In the substrate there may be integrated a power component different from a MOS transistor, for example a JFET or a diode.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A semiconductor device comprising:
   a semiconductor substrate;
   a high-voltage first resistive structure extending along a spiral path above the substrate and separated from the substrate by a first dielectric layer;
   a second resistive structure extending along a spiral path above the substrate, separated from the substrate by the first dielectric layer and concentric to the first resistive structure; and
   a conductive shielding structure that includes a plurality of first shielding strips arranged in sequence along respective portions of the first resistive structure and separated from the first resistive structure by a second dielectric layer, and a plurality of second shielding strips arranged in sequence along respective portions of the second resistive structure and separated from the second resistive structure by the second dielectric layer, the first shielding strips being separated from one another by a plurality of regions of discontinuity.

2. The semiconductor device according to claim 1, wherein the first resistive structure has a first terminal, a second terminal and an outlet node and comprises a first resistor between the first terminal and the outlet node, and a second resistor, between the second terminal and the outlet node, the first resistor and the second resistor forming a voltage divider.

3. The semiconductor device according to claim 2, comprising a supply line, the first resistive structure being coupled between terminals of the supply line.

4. The semiconductor device according to claim 3, comprising a power component in the substrate in a region corresponding to the first resistive structure, the power component having conduction terminals coupled to the first resistive structure.

5. The semiconductor device according to claim 1, wherein the first shielding strips are electrically coupled to respective portions of the first resistive structure by plugs arranged through the second dielectric layer.

6. The semiconductor device according to claim 5, comprising ohmic contact regions in positions corresponding to respective plugs.

7. The semiconductor device according to claim 1, wherein the first shielding strips are not directly in contact with one another.

8. The semiconductor device according to claim 7, wherein the first shielding strips have a width substantially equal to a width of the semiconductor strip forming the first resistive structure.

9. The semiconductor device according to claim 1, wherein the first shielding strips are coplanar with one another and parallel to the first resistive structure.

10. The semiconductor device according to claim 1, wherein the first resistive structure comprises a semiconductor strip extending along the spiral path.

11. The semiconductor device according to claim 1, wherein each first shielding strip extends over an angle not greater than 10°, for example, less than 6°.

12. The semiconductor device according to claim 1, wherein the second shielding strips are electrically coupled to respective portions of the second resistive structure by further plugs arranged through the second dielectric layer.

13. The semiconductor device according to claim 1 wherein the second shielding strips are not directly in contact with one another and with the first shielding strips.

14. A process for manufacturing a semiconductor device comprising:
   forming a first dielectric layer on a semiconductor substrate;
   forming, on the first dielectric layer, a first resistive structure extending along a first spiral path;
   forming, on the first dielectric layer, a second resistive structure extending along a second spiral path, the second resistive structure being concentric to the first resistive structure;
   forming a second dielectric layer on the first dielectric layer, so as to incorporate the first resistive structure and the second resistive structure; and
   forming a conductive shielding structure, comprising a plurality of first shielding strips arranged in sequence along respective portions of the first resistive structure, and a plurality of second shielding strips arranged in sequence along respective portions of the second resistive structure and separated from the second resistive structure by the second dielectric layer, the first shielding strips being separated from one another by a plurality of regions of discontinuity.

15. The process according to claim 14, comprising performing an annealing after having formed the shielding structure.

16. The process according to claim 15, wherein performing an annealing comprises using forming gas.

17. The process according to claim 14, wherein forming the shielding structure comprises:
   forming, in the second dielectric layer, apertures exposing respective portions of the first resistive structure and the second resistive structure;
   filling the apertures with a conductive material;
   depositing a metallic layer in contact with the conductive material in the apertures; and
   shaping the metallic layer so as to obtain the first shielding strips and the second shielding strips.

* * * * *